United States Patent
Gurney et al.

(10) Patent No.: US 7,502,206 B2
(45) Date of Patent: Mar. 10, 2009

(54) MULTIPLE EXTRAORDINARY MAGNETORESISTIVE (EMR) SENSOR UTILIZING BOTH CURRENT LEADS

(75) Inventors: Bruce Alvin Gurney, San Rafael, CA (US); Stefan Maat, San Jose, CA (US); Ernesto E. Marinero, Saratoga, CA (US); Bruce Alexander Wilson, San Jose, CA (US)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 427 days.

(21) Appl. No.: 11/492,375

(22) Filed: Jul. 24, 2006

(65) Prior Publication Data

US 2008/0019055 A1    Jan. 24, 2008

(51) Int. Cl.
    *G11B 5/33*    (2006.01)
(52) U.S. Cl. ...................................... 360/313
(58) Field of Classification Search ................. 360/313; 257/421
    See application file for complete search history.

(56) References Cited

U.S. PATENT DOCUMENTS

| | | | | |
|---|---|---|---|---|
| 3,715,522 | A | 2/1973 | Tsukagoshi | 179/100.2 |
| 3,835,376 | A | 9/1974 | Kataoka | 324/43 |
| 5,543,988 | A | 8/1996 | Brady et al. | 360/112 |
| 6,069,820 | A | 5/2000 | Inomata et al. | 365/171 |
| 6,707,122 | B1* | 3/2004 | Hines et al. | 257/421 |
| 6,714,374 | B1 | 3/2004 | Hayashi et al. | 360/66 |
| 6,930,862 | B2 | 8/2005 | Gill et al. | 360/313 |
| 7,167,346 | B2* | 1/2007 | Carey et al. | 360/313 |
| 7,170,722 | B2* | 1/2007 | Carey et al. | 360/324 |
| 7,203,036 | B2* | 4/2007 | Chattopadhyay et al. | 360/313 |
| 7,295,406 | B2* | 11/2007 | Chattopadhyay et al. | 360/313 |
| 2003/0128478 | A1* | 7/2003 | Gill et al. | 360/313 |
| 2004/0218309 | A1 | 11/2004 | Seigler | 360/313 |
| 2004/0257714 | A1 | 12/2004 | Takahashi et al. | 360/322 |
| 2004/0257894 | A1 | 12/2004 | Onogi et al. | 365/202 |
| 2007/0188933 | A1* | 8/2007 | Carey | 360/313 |
| 2008/0019055 | A1* | 1/2008 | Gurney et al. | 360/313 |

FOREIGN PATENT DOCUMENTS

WO    WO 01/67439    9/2001

OTHER PUBLICATIONS

Holz et al., "Enhanced Magnetoresistance of SemiConductor-Metal Hybrid Structures" American Institute of Physics 2005.

(Continued)

*Primary Examiner*—Tianjie Chen
(74) *Attorney, Agent, or Firm*—Zilka-Kotab, PC

(57) ABSTRACT

An extraordinary magnetoresistive device EMR sensor that is capable of reading two separate tracks of data simultaneously. The EMR sensor has a semiconductor structure with an electrically conductive shunt structure at one side. The other side of the semiconductor structure is connected with a pair of current leads. Each of the current leads is disposed between a pair of voltage leads. Each pair of voltage leads is capable of independently reading a magnetic signal by measuring the voltage potential change across the pair of voltage leads. The EMR structure minimizes the number of leads needed to read two magnetic signals by using a single pair of current leads to read two tracks of data.

23 Claims, 7 Drawing Sheets

OTHER PUBLICATIONS

Moussa et al., "Response of an Extraordinary Magnetoresistance Read Head to a Magnetic Bit" Journal of Applied Physics, American Institute of Physics Jul. 15, 2003.

Holz et al., "Enhanced Sensitivity Due to Current Redistribution In The Hall Effect of Semiconductor-metal Hybrid Structures" Applied Physics Letters, American Institute of Physics 2005.

* cited by examiner

MULTIPLE EXTRAORDINARY MAGNETORESISTIVE (EMR) SENSOR UTILIZING BOTH CURRENT LEADS

FIELD OF THE INVENTION

The present invention relates generally to an extraordinary magnetoresistive (EMR) sensors and more particularly to an EMR sensor design for increasing the data rate of a magnetic recording system.

BACKGROUND OF THE INVENTION

The heart of a computer's long term memory is an assembly that is referred to as a magnetic disk drive. The magnetic disk drive includes a rotating magnetic disk, write and read heads that are suspended by a suspension arm adjacent to a surface of the rotating magnetic disk and an actuator that swings the suspension arm to place the read and write heads over selected circular tracks on the rotating disk. The read and write heads are directly located on a slider that has an air bearing surface (ABS). The suspension arm biases the slider into contact with the surface of the disk when the disk is not rotating but, when the disk rotates, air is swirled by the rotating disk. When the slider rides on the air bearing, the write and read heads are employed for writing magnetic impressions to and reading magnetic impressions from the rotating disk. The read and write heads are connected to processing circuitry that operates according to a computer program to implement the writing and reading functions.

The write head includes a coil layer embedded in first, second and third insulation layers (insulation stack), the insulation stack being sandwiched between first and second pole piece layers. A gap is formed between the first and second pole piece layers by a gap layer at an air bearing surface (ABS) of the write head and the pole piece layers are connected at a back gap. Current conducted to the coil layer induces a magnetic flux in the pole pieces which causes a magnetic field to fringe out at a write gap at the ABS for the purpose of writing the aforementioned magnetic impressions in tracks on the moving media, such as in circular tracks on the aforementioned rotating disk.

In recent read head designs a spin valve sensor, also referred to as a giant magnetoresistive (GMR) sensor, has been employed for sensing magnetic fields from the rotating magnetic disk. The sensor includes a nonmagnetic conductive layer, hereinafter referred to as a spacer layer, sandwiched between first and second ferromagnetic layers, hereinafter referred to as a pinned layer and a free layer. First and second leads are connected to the spin valve sensor for conducting a sense current therethrough. The magnetization of the pinned layer is oriented generally perpendicular to the air bearing surface (ABS) and the magnetic moment of the free layer is oriented generally parallel to the ABS, but free to rotate in response to external magnetic fields. The magnetization of the pinned layer is typically pinned by exchange coupling with an antiferromagnetic layer.

The thickness of the spacer layer is chosen to be less than the mean free path of conduction electrons through the sensor. With this arrangement, a portion of the conduction electrons is scattered by the interfaces of the spacer layer with each of the pinned and free layers. When the magnetizations of the pinned and free layers are parallel with respect to one another, scattering is minimal and when the magnetizations of the pinned and free layer are antiparallel, scattering is maximized. Changes in scattering alter the resistance of the spin valve sensor in proportion to $\cos \theta$, where $\theta$ is the angle between the magnetizations of the pinned and free layers. In a read mode the resistance of the spin valve sensor changes proportionally to the magnitudes of the magnetic fields from the rotating disk. When a sense current is conducted through the spin valve sensor, resistance changes cause potential changes that are detected and processed as playback signals.

The drive for ever increased data rate and data capacity has, however, lead researchers to search for new types of magnetoresistive sensors, capable of increased sensitivity at decreased track widths. One type of magnetoresistive sensor that has been proposed is what has been called an Extraordinary Magnetoresistive Sensor (EMR). An advantage of EMR sensors is that the active region of the EMR sensor is constructed of non-magnetic semiconductor materials, and does not suffer from the problem of magnetic noise that exists in giant magnetoresistive sensors (GMR) and tunnel valves, both of which use magnetic films in their active regions.

The EMR sensor includes a pair of voltage leads and a pair of current leads in contact with one side of the active region and an electrically conductive shunt in contact with the other side of the active region. In the absence of an applied magnetic field, sense current through the current leads passes into the semiconductor active region and is shunted through the shunt. When an applied magnetic field is present, current is deflected from the shunt and passes primarily through the semiconductor active region. The change in electrical resistance due to the applied magnetic field is detected across the voltage leads. EMR is described by T. Zhou et al., "Extraordinary magnetoresistance in externally shunted van der Pauw plates", Appl. Phys. Lett., Vol. 78, No. 5, 29 Jan. 2001, pp. 667-669.

However, even with the advantages of such EMR devices, there is an ever pressing need for increasing the data rate and data density of data that can be read from a device.

Therefore, there is a strong felt need for a device such as an extraordinary magnetoresitive (EMR) device that can read data at a very high data rate for example by reading data from multiple tracks with high signal to noise ratio both simultaneously and independently. In addition, an EMR sensor design capable of reading multiple tracks, but only using a single pair of current leads will preferably facilitate manufacture such as by maximizing the utilization of the leads formed thereon.

SUMMARY OF THE INVENTION

The present invention provides an EMR sensor having the ability to read two spatially separated different magnetic signals. The sensor has a semiconductor structure with an electrically conductive shunt structure at one side of the semiconductor structure. The other side of the semiconductor structure has a pair of current leads for conducting a sense current to the sensor. Each current lead is disposed between a pair of voltage leads, each pair of voltage leads being capable of measuring a magnetic signal by measuring the voltage potential change across the pair of voltage leads.

In a first embodiment the EMR sensor may have first, second, third and fourth voltage leads, with the first current lead being located between the first and second voltage leads and the second current lead being located between the third and fourth voltage leads. The first and second voltage leads are separated by about a recorded trackwidth or less. The same applies to the separation of the third and fourth voltage leads. Each current lead can be substantially centrally disposed between its respective voltage leads. A sensor according to this embodiment provides two independent signals in a single EMR device.

An EMR sensor according to another embodiment of the invention can include first and second semiconductor structures with an electrically conductive shunt structure sandwiched between the first and second semiconductor structures. The shunt structure could be a single electrically conductive shunt structure shared by both semiconductor structures, or could include a pair of electrically conductive shunt layers with a non-magnetic, electrically insulating spacer layer sandwiched between the shunt layers. Each of the semiconductor layers can have a pair of current leads, each current lead being located between a pair of voltage leads. A sensor according to this embodiment provides four independent signals in a single EMR device.

An EMR device according to the present invention provides a dramatic increase in data rate. In addition, the invention minimizes the number of leads that must be constructed by utilizing a single pair of current leads for reading two data signals.

These and other features and advantages of the invention will be apparent upon reading of the following detailed description of preferred embodiments taken in conjunction with the Figures in which like reference numerals indicate like elements throughout.

BRIEF DESCRIPTION OF THE DRAWINGS

For a fuller understanding of the nature and advantages of this invention, as well as the preferred mode of use, reference should be made to the following detailed description read in conjunction with the accompanying drawings which are not to scale.

DETAILED DESCRIPTION OF THE PREFERRED EMBODIMENTS

The following description is of the best embodiments presently contemplated for carrying out this invention. This description is made for the purpose of illustrating the general principles of this invention and is not meant to limit the inventive concepts claimed herein.

Figure 1:
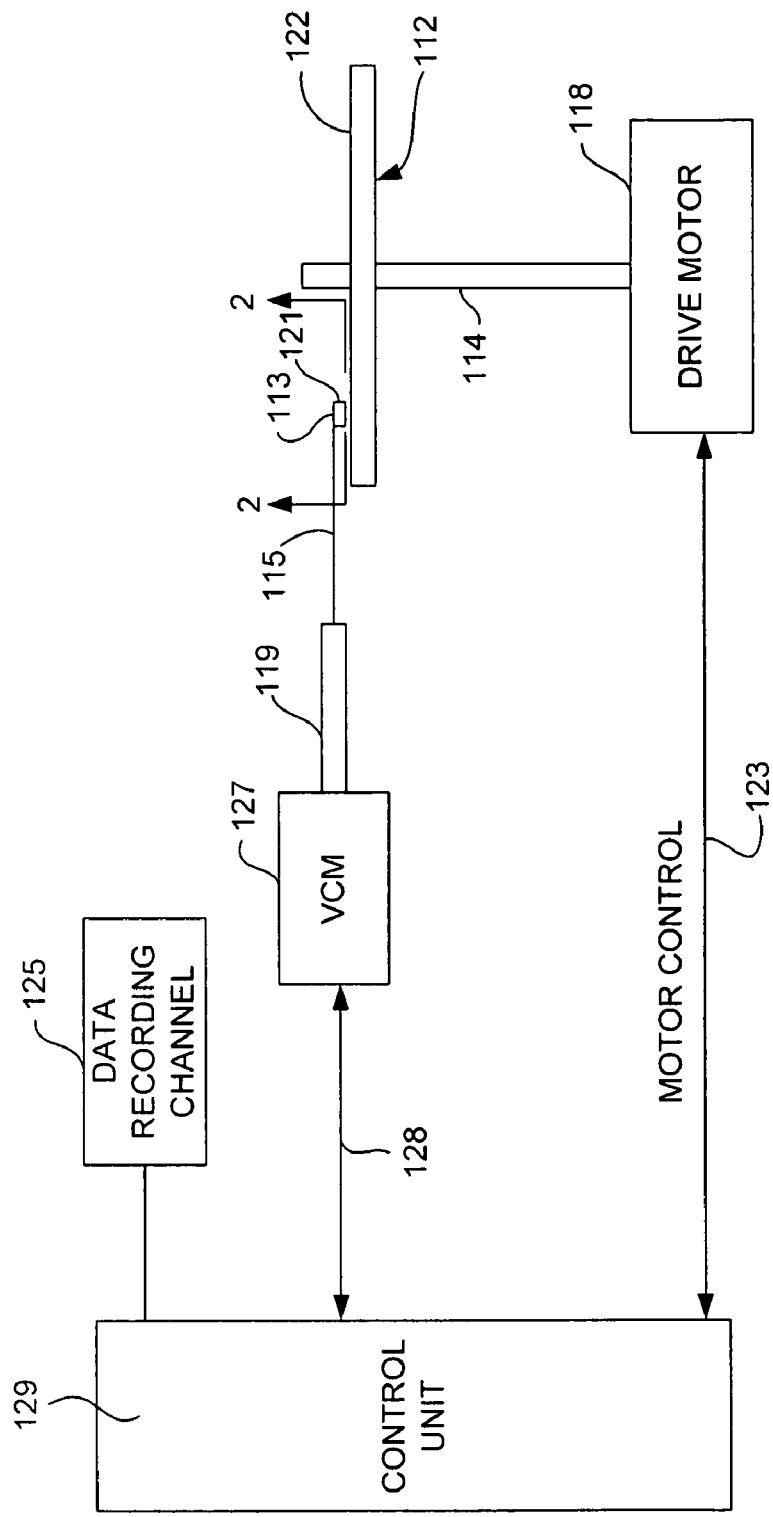
FIG. 1 is a schematic illustration of a disk drive system in which the invention might be embodied.

Referring now to FIG. 1, there is shown a disk drive 100 embodying this invention. As shown in FIG. 1, at least one rotatable magnetic disk 112 is supported on a spindle 114 and rotated by a disk drive motor 118. The magnetic recording on each disk is in the form of annular patterns of concentric data tracks (not shown) on the magnetic disk 112.

At least one slider 113 is positioned near the magnetic disk 112, each slider 113 supporting one or more magnetic head assemblies 121. As the magnetic disk rotates, slider 113 moves radially in and out over the disk surface 122 so that the magnetic head assembly 121 may access different tracks of the magnetic disk where desired data are written. Each slider 113 is attached to an actuator arm 119 by way of a suspension 115. The suspension 115 provides a slight spring force which biases slider 113 against the disk surface 122. Each actuator arm 119 is attached to an actuator means 127. The actuator means 127 as shown in FIG. 1 may be a voice coil motor (VCM). The VCM comprises a coil movable within a fixed magnetic field, the direction and speed of the coil movements being controlled by the motor current signals supplied by controller 129.

During operation of the disk storage system, the rotation of the magnetic disk 112 generates an air bearing between the slider 113 and the disk surface 122 which exerts an upward force or lift on the slider. The air bearing thus counter-balances the slight spring force of suspension 115 and supports slider 113 off and slightly above the disk surface by a small, substantially constant spacing during normal operation.

The various components of the disk storage system are controlled in operation by control signals generated by control unit 129, such as access control signals and internal clock signals. Typically, the control unit 129 comprises logic control circuits, storage means and a microprocessor. The control unit 129 generates control signals to control various system operations such as drive motor control signals on line 123 and head position and seek control signals on line 128. The control signals on line 128 provide the desired current profiles to optimally move and position slider 113 to the desired data track on disk 112. Write and read signals are communicated to and from write and read heads 121 by way of recording channel 125.

Figure 2:
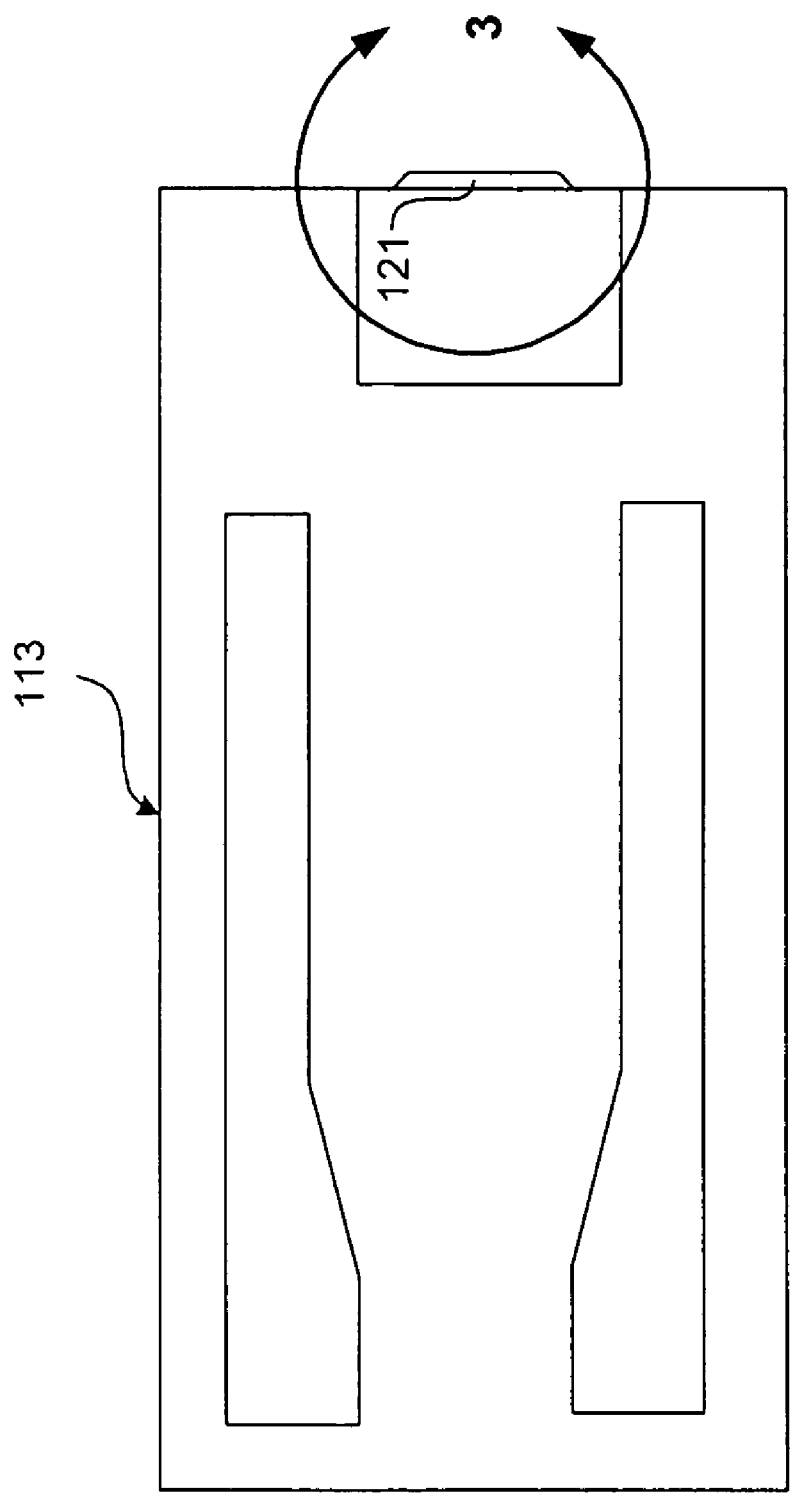
FIG. 2 is an ABS view of a slider illustrating the location of a magnetic head thereon.

With reference to FIG. 2, the orientation of the magnetic head 121 in a slider 113 can be seen in more detail. FIG. 2 is an ABS view of the slider 113, and as can be seen the magnetic head including an inductive write head and a read sensor, is located at a trailing edge of the slider. The above description of a typical magnetic disk storage system, and the accompanying illustration of FIG. 1 are for representation purposes only. It should be apparent that disk storage systems may contain a large number of disks and actuators, and each actuator may support a number of sliders.

Figure 3:
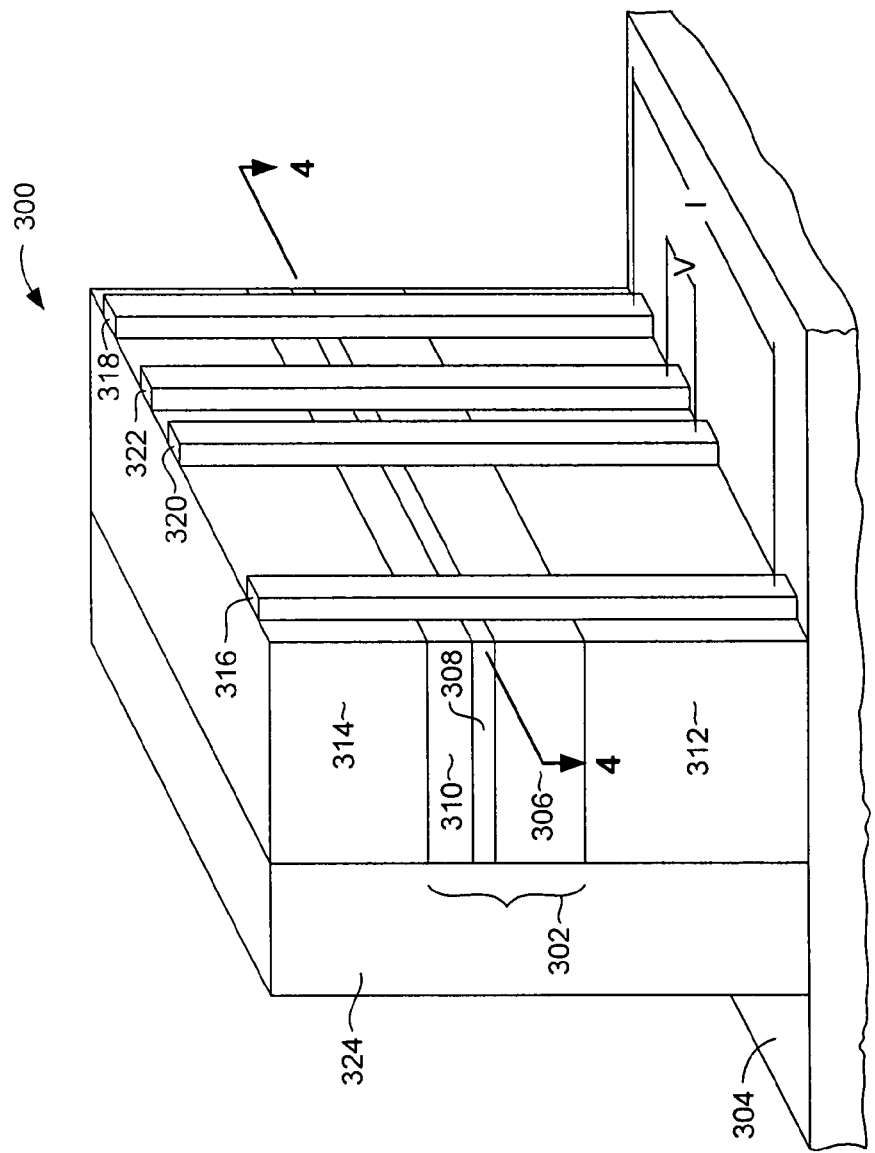
FIG. 3 is schematic isometric view of an EMR device according to the prior art.

With reference now to FIG. 3, a prior art extraordinary magnetoresistive sensor (EMR) 300 for use in a magnetic head 121 (FIG. 2) is shown. The EMR sensor 300 may include a structure 302 that is a III-V heterostructure formed on a semiconductor substrate 304 such as GaAs. However, the EMR sensor described in this invention is not restricted to III-V semiconductor materials. For example, it may also be formed on the basis of silicon or germanium. The heterostructure 302 includes a first layer 306 of semiconducting material having a first band-gap, a second layer 308 of semiconducting material formed on the first layer 306 and having a second bandgap that is smaller than that of the first layer 306, and a third semiconducting layer 310 of semiconducting material formed on top of the second layer 308 and having a third band gap that is greater than the second band gap. The materials in the first and third layers 306, 310 may be similar or identical. An energetic potential well (quantum well) is created by the first, second and third semiconducting material layers due to the different band-gaps of the different materials. Thus, carriers can be confined inside layer 308, which is considered the EMR active film in the sensor 300.

The first layer 306 is typically formed on top of a buffer layer 312 that may be one or more layers. The buffer layer 312 comprises several periods of a superlattice structure that functions to prevent impurities present in the substrate from migrating into the functional layers 306, 308, 310. In addition, the buffer layer 312 is chosen to accommodate the typically different lattice constants of the substrate 304 and the functional layers of the heterostructure 302 to thus act as a strain relief layer between the substrate and the functional layers.

One or more doped layers are incorporated into the semiconducting material in the first layer 306, the third layer 310, or both layers 306 and 310, and spaced apart from the boundary of the second and third semiconducting materials. The doped layers provide electrons (if n-doped) or holes (if p doped) to the quantum well. The electrons or holes are concentrated in the quantum well in the form of a two dimensional electron-gas or hole-gas, respectively.

The layers 306, 308, 310 may be a $Al_{0.09}In_{0.91}Sb/InSb/Al_{0.09}In_{0.91}Sb$ heterostructure grown onto a semi-insulating GaAs substrate 304 with a buffer layer 312 in between. InSb is a narrow band-gap semiconductor. Narrow band-gap semiconductors typically have a high electron mobility, since the effective electron mass is greatly reduced. Typical narrow band-gap materials are InSb and InAs. For example, the room temperature electron mobility of InSb and InAs are 70,000 $cm^2/Vs$ and 35,000 $cm^2/Vs$, respectively.

The bottom $Al_{0.09}In_{0.91}Sb$ layer 306 formed on the buffer layer 312 has a thickness in the range of approximately 1-3 microns and the top $Al_{0.09}In_{0.91}Sb$ layer 310 has a thickness in the range of approximately 10 to 1000 nm, typically 50 nm. The doping layers incorporated into layers 306, 310 have a thickness from one monolayer (delta-doped layer) up to 10 nm. The doping layer is spaced from the $InSb/Al_{0.09}In_{0.91}Sb$ boundaries of first and second or second and third semiconducting materials by a distance of 10-300 Angstrom. N-doping is preferred, since electrons typically have higher mobility than holes. The typical n-dopant is silicon with a concentration in the range of 1 to $10^{19}/cm^3$. The deposition process for the heterostructure 302 is preferably molecular-beam-epitaxy, but other epitaxial growth methods can be used.

A capping layer 314 is formed over the heterostructure 302 to protect the device from corrosion. The capping layer 314 is formed of an insulating material such as oxides or nitrides of aluminum or silicon (e.g., $Si_3N_4$, $Al_2O_3$) or a non-corrosive semi-insulating semiconductor.

Two current leads 316, 318 and two voltage leads 320, 322 are patterned over one side of the EMR structure 302 so that they make electrical contact with the quantum well. A metallic shunt 324 is patterned on the side opposite the current and voltage leads of the EMR structure 302 so that it makes electrical contact with the quantum well. An applied magnetic field H (FIG. 4), i.e., the magnetic field to be sensed, is generally oriented normal to the plane of the layers in the EMR structure 302. The leads typically comprise metallic contacts, for example Au, AuGe, or Ge diffused into the device. The leads are typically formed after formation of the capping layer 314, and sometimes after removal of some of the capping layer material.

Figure 4:
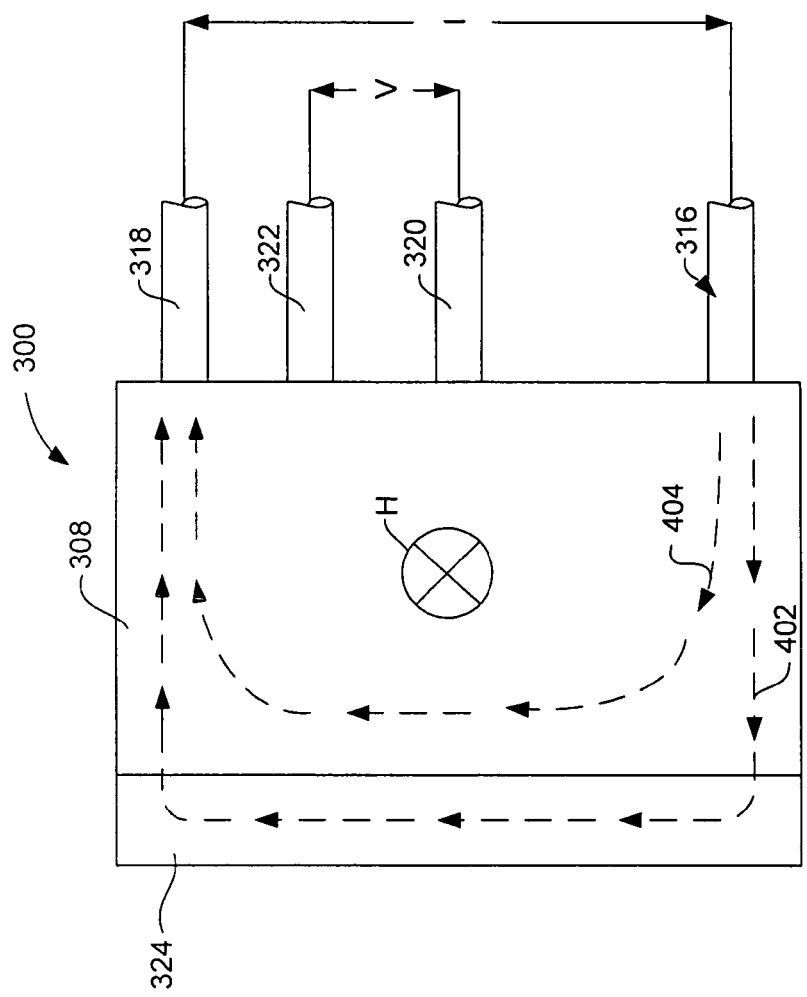
FIG. 4 is a view taken from line 4-4 of FIG. 3.

FIG. 4 is a top schematic view of the EMR sensor 300 through a section of the active film 308 and will illustrate the basic operation of the sensor. In the absence of an applied magnetic field H, sense current through the leads 316, 318 passes into the semiconductor active film 308 and is shunted through the shunt 324, as shown by line 402. When an applied magnetic field H, having a component perpendicular to the plane of the layers in the EMR structure 302, is present, as shown by the arrow tail into the paper in FIG. 2, current is deflected from the shunt 324 and passes primarily through the semiconductor active film 308, as shown by line 404. The change in electrical resistance due to the applied magnetic field is detected across the voltage leads 320, 322.

THE INVENTION

Figure 5:
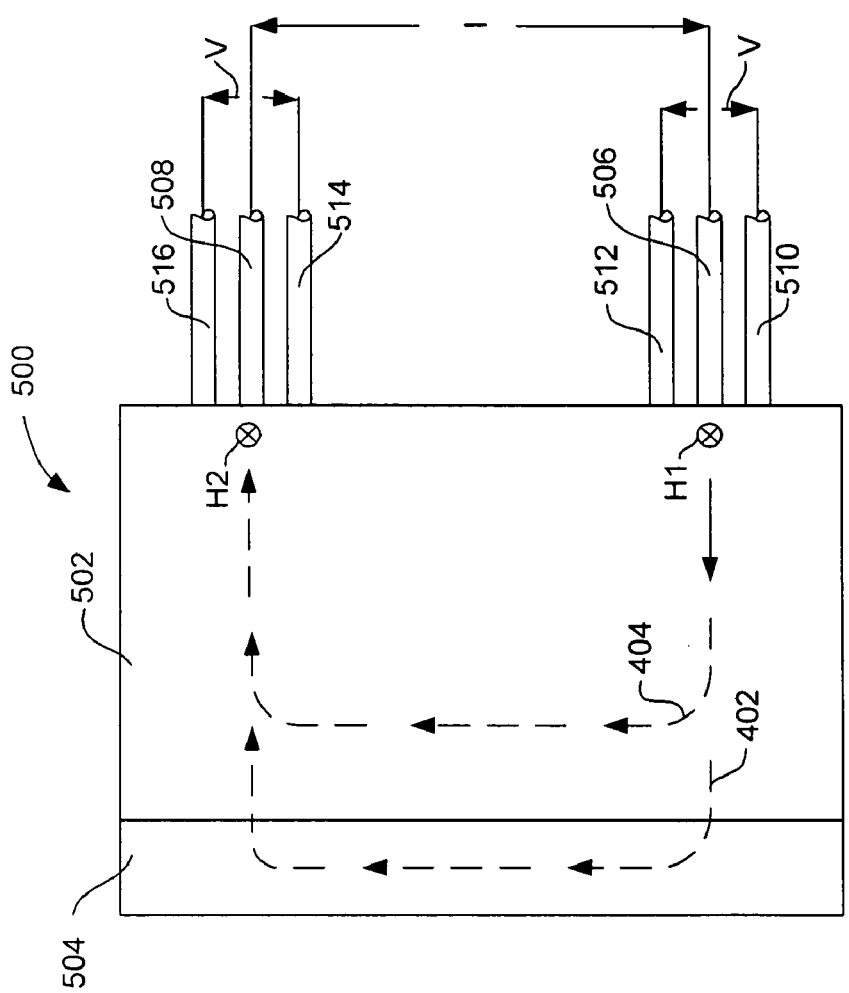
FIG. 5 is a cross sectional view of an EMR device according to an embodiment of the present invention.

With reference now to FIG. 5 an EMR sensor 500 according to an embodiment of the invention is shown. FIG. 5 is similar to FIG. 4 in that it is a top schematic view of the EMR sensor 500. The sensor 500 has a semiconductor structure 502 in an active portion of the sensor 500 and has a shunt structure 504. As can be seen in FIG. 5, an EMR sensor 500 according to the present invention has a VIVVIV structure. Therefore, the sensor has first and second current leads 506, 508, and also has first, second, third, and fourth voltage leads 510, 512, 514 and 516 all located opposite the shunt structure 504. The first and second voltage leads 510, 512 are located at either side of the first current lead 506, while the third and forth voltage leads 514, 516 are located at either side of the second current lead 508.

With continued reference to FIG. 5, one of the current leads, such as for example 506 is an input current lead, where a sense current is input to the sensor 500 as described previously. The other current lead, such as for example the lead 508, is an output lead from which the sense current exits the sensor 500. In the absence of a magnetic field H1 or H2, a majority of the sense current 402 is shunted through the shunt structure 324. However, when a magnetic field H1 or H2 is applied, some of the sense current 404 passes through the part of the active portion 502 that is close to the field H1 or H2. The path 404 illustrates the example where the perpendicular components of H1 and H2 have about the same amplitude.

As can be seen, then, a sensor 500 according to the present invention has two pairs of voltage leads, 510, 512 and 514, 516. By measuring the voltage across either of these voltage pairs, a magnetic field can be detected for that region of the sensor 500. In this way, the sensor 500 has the unique ability to read two separate tracks of data simultaneously using the same sensor 500. Since each pair of voltage leads shares a common pair of current leads, the number of leads that must be fabricated to read two tracks of data is reduced dramatically.

Furthermore, it has been found that locating the voltage leads 510, 512, 514, 516 at either side of a current lead provides a dramatic increase in signal sensitivity over a IVVI arrangement of leads provided by a prior art design, such as that described above with reference to FIGS. 3 and 4. Therefore, the efficiency, manufacturability and sensitivity are all increased dramatically by a sensor according to an embodiment of the present invention.

The voltage leads 514, 516 are preferably separated from one another by about a recorded track-width or less. The same applies to the separation of the voltage leads 510, 512. The voltage leads are preferably symmetrically disposed about their respective current lead. In other words, the current lead 508 is preferably located substantially at a midpoint between the voltage leads 514, 516. Similarly, the current lead 506 is preferably located substantially at a midpoint between the voltage leads 510, 512. The current leads 506, 508 are preferably separated from one another far enough that they are positioned above separate recorded tracks on the disc.

Figure 6A:
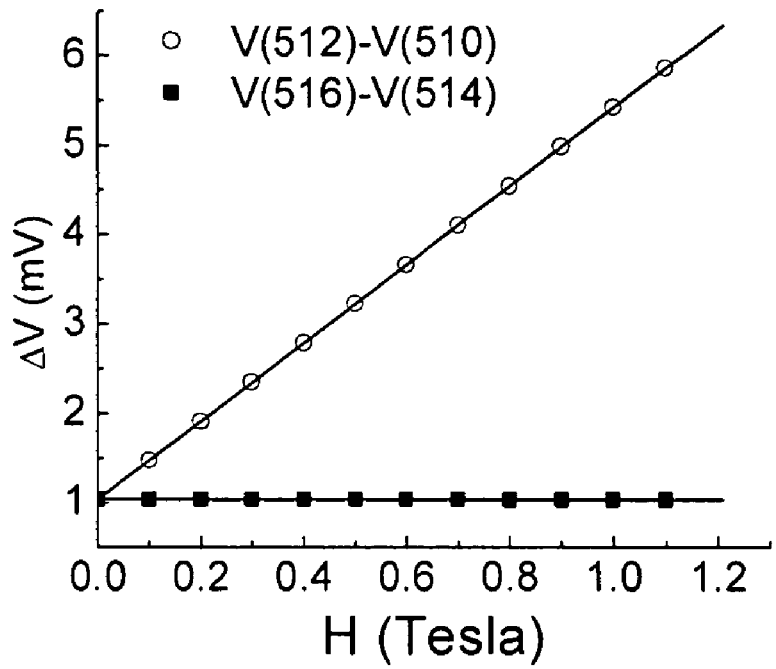
FIGS. 6A and 6B are graphical illustrations showing the voltage response of a magnetoresistive sensor according to an embodiment of the invention.
Figure 6B:
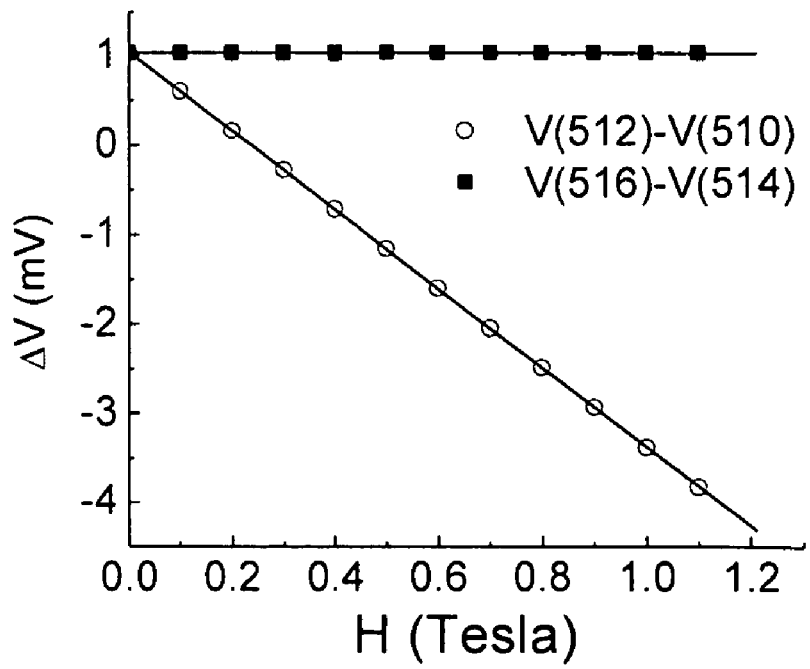

FIG. 6, shows the calculated response of an EMR sensor like the one depicted in FIG. 5. The simulated sensor has a 2DEG with a sheet resistance of 1000 $\Omega$/sq, a mobility of 10,000 $cm^2/Vs$, a Au shunt and leads with a resistivity of 4.5 $\mu\Omega$ cm, and a contact resistance between the Au and the 2DEG of $3 \cdot 10^{-6}$ $\Omega$ $cm^2$. The voltage and current lead width was 100 nm with the current leads being positioned in the center of the voltage leads. The voltage lead separation measured from center to center was 300 nm. FIG. 6A shows the response of the sensor to an increasing magnetic field in between the first and second voltage leads, 512 and 510, respectively. While the voltage difference increases linearly between 512 and 510 at a rate of about 4.4 mV/Tesla, it remains constant between 516 and 514. Similarly, FIG. 6B shows the response of the sensor to an increasing magnetic field in between the third and fourth voltage leads, 516 and 514, respectively. While the voltage difference decreases linearly between 516 and 514 at a rate of about −4.4 mV/Tesla, it remains constant between 512 and 510. Thus it is demonstrated that the response of the sensor is local. Since the superposition principle applies to this problem, the sensor can detect any bits between the two pairs of voltage leads simultaneously without crosstalk.

Figure 7:
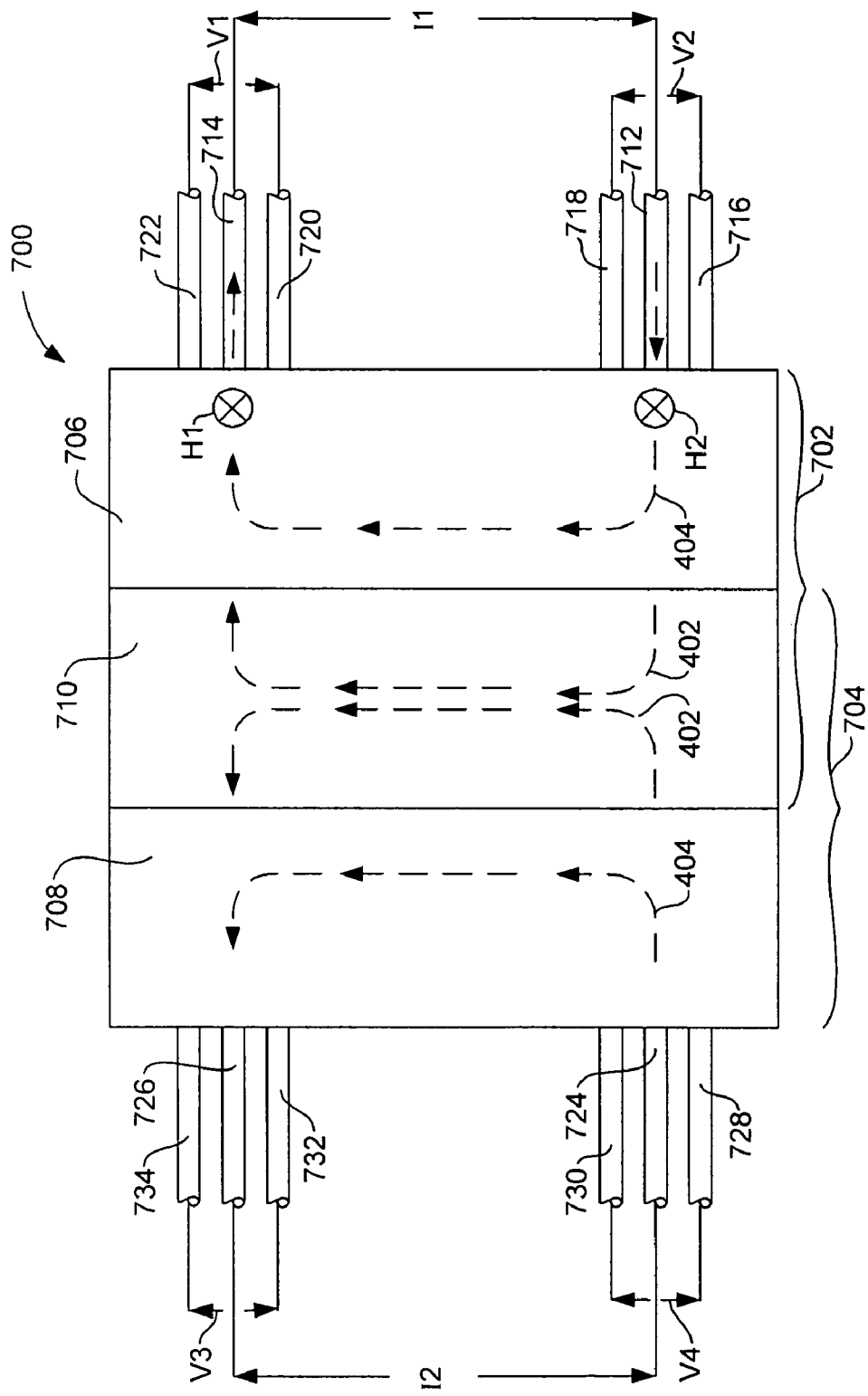
FIG. 7 is a schematic view of an EMR sensor according to an alternate embodiment of the invention.

With reference now to FIG. 7, a sensor 700 according to an alternate embodiment of the invention includes a pair of sensor elements 702, 704 each sensor element having two pairs of voltage leads and each being capable or reading two separate tracks of data simultaneously. The sensor elements each include a semiconductor layer providing an active portion 706, 708 and an electrically conductive shunt portion 710. The sensor elements 702, 704 may share a common shunt structure 710 or, optionally may be constructed each with a separate shunt structure, the two shunt structures being separated by a non-magnetic, electrically insulating spacer layer (not shown). Such a spacer layer could be, for example, constructed of an oxide or nitride of alumina or silicon or could be an air gap.

The first sensor element has a pair of current leads 712, 714. Each of the current leads 712, 714 is disposed between a pair of voltage leads 716, 718, 720, 722. Similarly, the second sensor element 704 has a pair of current leads 724, 726, each disposed between a pair of voltage leads 728, 730, 732, 734. The embodiment described in FIG. 7 essentially provides four read sensors in a single sensor structure.

According to an embodiment of the present invention, a plurality of sensors, such as those described above in FIGS. 5 and 7 can be arranged in an EMR array (not shown) in a magnetic data recording system. As can be appreciated, since each sensor structure can read two tracks of data, the data rate capability of such a system is greatly enhanced. Additionally, since an array of more such elements provides the ability to read more data per unit length of time, data rate is increased. In addition, if the same data is read multiple times with different EMR elements in the array the signal to noise will be increased.

In addition, an EMR sensor according to an embodiment of the invention, such as EMR sensors 500 or 700 can be used in a scanning probe system. Such an EMR sensor could also be used as a field gradient magnetometer, in which the difference in the changes in the EMR signal from each EMR sensor when placed in a spacially varying magnetic field are used to measure the magnetic field gradient. Other uses for an EMR sensor according to an embodiment of the invention will, no doubt, be apparent to those skilled in the art, and would also fall within the intended scope of the invention.

A pair of voltage leads (for example 722, 720) on one of the sensor elements 702 can be aligned with a pair of voltage leads (for example 732, 734) on the other sensor element 704, so that the two pairs of voltage leads read the same data track. This can reduce signal noise and increase signal read reliability. Alternatively, the sensor pairs 720, 722 and 716, 718 of one of the sensor elements 702 can be offset from the voltage pairs 732, 734 and 728, 730 of the other sensor element so that each of the voltage pairs can read a different track of data, thereby allowing four different tracks of data to be read simultaneously.

As track widths become ever smaller, it would be possible to decrease the size of the EMR sensor even further. With reference again to FIG. 5, in an extremely small EMR sensor it would be possible to combine the inner voltage leads 512, 514 into a single shared voltage lead. In that case, the EMR sensor would have a VIVIV structure with a first and second voltage lead forming a first voltage lead pair and the second and third voltage leads forming a second voltage lead pair.

In a similar manner, with reference to FIG. 7, the second and third voltage leads 718, 720 could be combined into a single shared center voltage lead and the sixth and seventh voltage leads 732, 730 could also be combined into a single, shared, center voltage lead. This would result in a pair of back to back EMR sensors, each having a VIVIV structure.

While various embodiments have been described above, it should be understood that they have been presented by way of example only, and not limitation. Other embodiments falling within the scope of the invention may also become apparent to those skilled in the art. Thus, the breadth and scope of the invention should not be limited by any of the above-described exemplary embodiments, but should be defined only in accordance with the following claims and their equivalents.

What is claimed is:

1. An extraordinary magnetoresistive sensor (EMR sensor), comprising:
    a semiconductor structure;
    an electrically conductive shunt structure connected with the semiconductor structure at a first side of the semiconductor structure;
    a pair of current leads, electrically connected with the semiconductor structure at a second side of the semiconductor structure that is opposite the first side;
    first and second voltage leads electrically connected with the second side of the semiconductor structure and arranged so that the first current lead is disposed between the first and second voltage leads; and
    third and fourth voltage leads electrically connected with the second side of the semiconductor structure and arranged so that the second current lead is disposed between the third and fourth voltage leads.

2. An EMR sensor as in claim 1 wherein the first and second voltage leads are symmetrically disposed about the first current lead, and the third and fourth voltage leads are symmetrically disposed about the second current lead.

3. An EMR sensor as in claim 1 wherein the EMR sensor is used as a local magnetic field sensor in a scanning probe system.

4. An EMR sensor as in claim 1 wherein the EMR sensor is a field gradient magnetometer, in which the difference in the changes in the EMR signal from each EMR sensor when placed in a spacially varying magnetic field are used to measure the magnetic field gradient.

5. An EMR sensor as in claim 1, wherein the EMR sensor is configured to read a magnetic signal having a trackwidth, and wherein first and second voltage leads are separated by a distance that is about equal to or less than the trackwidth.

6. An EMR sensor as in claim 1 wherein the EMR sensor is configured to read a data track having a trackwidth, and wherein the third and fourth magnetic signals are separated by a distance that is about equal to or less than the trackwidth.

7. An EMR sensor as in claim 1 wherein the EMR sensor is configured to read first and second data tracks each having a track width and wherein the first and second voltage leads are separated by a distance that is no greater than the trackwidth of the first data track and the third and fourth voltage leads are separated by a distance that is no greater than the trackwidth of the second data track.

8. An EMR sensor as in claim 1 wherein the first and second voltage leads are separated from one another by a distance of about 300 nm.

9. An extraordinary magnetoresistive (EMR) sensor, comprising:
- a first semiconductor structure;
- a second semiconductor structure;
- an electrically conductive shunt structure disposed between the first and second semiconductor structures;
- first, second, third and fourth electrically conductive voltage leads, electrically connected with the first semiconductor structure at a side of the semiconductor structure opposite the shunt structure;
- fifth, sixth, seventh and eighth electrically conductive voltage leads electrically connected with the second semiconductor structure at a side of the second semiconductor structure that is opposite the shunt structure;
- a first current lead, electrically connected with the side of the first semiconductor structure and disposed between the first and second voltage leads;
- a second current lead, electrically connected with the side of the first semiconductor structure and disposed between the third and fourth voltage leads;
- a third current lead, electrically connected with the side of the second semiconductor structure and disposed between the fifth and sixth voltage leads; and
- a fourth current lead, electrically connected with the side of the second semiconductor structure and disposed between the seventh and eighth voltage leads.

10. An EMR sensor as in claim 9 wherein the EMR sensor is configured to read first and second data signals each having a trackwidth and wherein the first and second voltage leads are separated by a distance that is about equal to or less than the trackwidth of the first data signal and the third and fourth voltage leads are separated by a distance that is about equal to or less than the trackwidth of the second data signal.

11. An EMR sensor as in claim 9 wherein:
- the EMR sensor is configured to read first and second data signals each having a trackwidth;
- the first and second voltage leads are separated by a distance about equal to or less than the track width of the first data signal;
- the third and fourth voltage leads are separated by a distance about equal to or less than the trackwidth of the second data signal;
- the fifth and sixth voltage leads are separated by a distance about equal to or less than the trackwidth of the first data signal; and
- the seventh and eighth voltage leads are separated by a distance that is about equal to or less than the trackwidth of the second data signal.

12. An EMR sensor as in claim 9 wherein the first and second voltage leads form a first voltage lead pair, the third and fourth voltage leads form a second voltage lead pair, the fifth and sixth voltage leads form a third voltage lead pair and the seventh and eighth voltage leads form a fourth voltage lead pair, and wherein the voltage leads of least one of the first, second, third and fourth voltage leads pairs are separated by a distance of about 300 nm.

13. An EMR sensor as in claim 9 wherein the first and second voltage leads form a first voltage lead pair, the third and fourth voltage leads form a second voltage lead pair, the fifth and sixth voltage leads form a third voltage lead pair and the seventh and eighth voltage leads form a fourth voltage lead pair, and wherein the first voltage lead pair is aligned with the third voltage lead pair and the second voltage lead pair is aligned with the fourth voltage lead pair.

14. An EMR sensor as in claim 9 wherein the first and second voltage leads form a first voltage lead pair, the third and fourth voltage leads form a second voltage lead pair, the fifth and sixth voltage leads form a third voltage lead pair and the seventh and eighth voltage leads form a fourth voltage lead pair, and wherein the first and second voltage lead pairs are offset from the third and fourth voltage lead pairs.

15. An extraordinary magnetoresistive (EMR) sensor, comprising:
- a first semiconductor structure;
- a second semiconductor structure;
- an electrically conductive shunt structure disposed between the first and second semiconductor structures, the shunt structure comprising first and second electrically conductive shunts separated from one another by a non-magnetic, electrically insulating spacer layer;
- first, second, third and fourth electrically conductive voltage leads, electrically connected with the first semiconductor structure at a side of the semiconductor structure opposite the shunt structure;
- fifth, sixth, seventh and eighth electrically conductive voltage leads electrically connected with the second semiconductor structure at a side of the second semiconductor structure that is opposite the shunt structure;
- a first current lead, electrically connected with the side of the first semiconductor structure and disposed between the first and second voltage leads;
- a second current lead, electrically connected with the side of the first semiconductor structure and disposed between the third and fourth voltage leads;
- a third current lead, electrically connected with the side of the second semiconductor structure and disposed between the fifth and sixth voltage leads; and
- a fourth current lead, electrically connected with the side of the second semiconductor structure and disposed between the seventh and eighth voltage leads.

16. An EMR sensor as in claim 15 wherein the non-magnetic, electrically insulating spacer layer comprises an oxide or nitride of aluminum or silicon or an air gap.

17. An EMR sensor as in claim 15 wherein:
- the first current lead is substantially centrally disposed between the first and second voltage leads;
- the second current lead is substantially centrally disposed between the third and fourth voltage leads;
- the third current lead is substantially centrally disposed between the fifth and sixth voltage leads; and
- the fourth current lead is substantially centrally disposed between the seventh and eight voltage leads.

18. An EMR sensor as in claim 15 wherein the EMR sensor is configured to read first and second data signals each having a trackwidth and wherein the first and second voltage leads are separated by a distance that is about equal to or less than the trackwidth of the first data signal and the third and fourth voltage leads are separated by a distance that is about equal to or less than the trackwidth of the second data signal.

19. An EMR sensor as in claim 15 wherein:
- the EMR sensor is configured to read first and second data signals each having a trackwidth;
- the first and second voltage leads are separated by a distance about equal to or less than the track width of the first data signal;
- the third and fourth voltage leads are separated by a distance about equal to or less than the trackwidth of the second data signal;
- the fifth and sixth voltage leads are separated by a distance about equal to or less than the trackwidth of the first data signal; and the seventh and eighth voltage leads are separated by a distance that is about equal to or less than the trackwidth of the second data signal.

20. A magnetic data recording system, comprising:
a magnetic medium;
a slider;
an actuator connected with the slider for moving the slider adjacent to a surface of the magnetic medium;
an extraordinary magnetoresistive (EMR) sensor, comprising:
a semiconductor structure;
an electrically conductive shunt structure connected with the semiconductor structure at a first side of the semiconductor structure;
a pair of current leads, electrically connected with the semiconductor structure at a second side of the semiconductor structure that is opposite the first side;
first and second voltage leads electrically connected with the second side of the semiconductor structure and arranged so that the first current lead is disposed between the first and second voltage leads; and
third and fourth voltage leads electrically connected with the second side of the semiconductor structure and arranged so that the second current lead is disposed between the third and fourth voltage leads.

21. A EMR sensor as in claim 20 wherein the first and second voltage leads are symmetrically disposed about the first current lead, and the third and fourth voltage leads are symmetrically disposed about the second current lead.

22. An extraordinary magnetoresistive sensor (EMR sensor), comprising:
a semiconductor structure;
an electrically conductive shunt structure connected with the semiconductor structure at a first side of the semiconductor structure;
a pair of current leads, electrically connected with the semiconductor structure at a second side of the semiconductor structure that is opposite the first side; and
first, second and third voltage leads electrically connected with the second side of the semiconductor structure and arranged so that the first current lead is disposed between the first and second voltage leads and the second current lead is disposed between the second and third voltage leads.

23. An extraordinary magnetoresistive (EMR) sensor, comprising:
a first semiconductor structure;
a second semiconductor structure;
an electrically conductive shunt structure disposed between the first and second semiconductor structures;
first, second, and third electrically conductive voltage leads, electrically connected with the first semiconductor structure at a side of the semiconductor structure opposite the shunt structure;
fourth, fifth and sixth electrically conductive voltage leads electrically connected with the second semiconductor structure at a side of the second semiconductor structure that is opposite the shunt structure;
a first current lead, electrically connected with the side of the first semiconductor structure and disposed between the first and second voltage leads;
a second current lead, electrically connected with the side of the first semiconductor structure and disposed between the second and third voltage leads;
a third current lead, electrically connected with the side of the second semiconductor structure and disposed between the fourth and fifth voltage leads; and
a fourth current lead, electrically connected with the side of the second semiconductor structure and disposed between the fifth and sixth voltage leads.

* * * * *